(12) United States Patent
Moon

(10) Patent No.: US 10,474,300 B2
(45) Date of Patent: Nov. 12, 2019

(54) DISPLAY DEVICE

(71) Applicant: SAMSUNG DISPLAY CO., LTD., Yongin-si, Gyeonggi-do (KR)

(72) Inventor: Kyungha Moon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/703,326

(22) Filed: Sep. 13, 2017

(65) Prior Publication Data

US 2018/0081466 A1    Mar. 22, 2018

(30) Foreign Application Priority Data

Sep. 20, 2016  (KR) .................. 10-2016-0120130

(51) Int. Cl.
| | | |
|---|---|---|
| *G06F 3/041* | (2006.01) | |
| *G06F 3/044* | (2006.01) | |
| *H01L 41/113* | (2006.01) | |
| *G06F 3/047* | (2006.01) | |

(52) U.S. Cl.
CPC ............ *G06F 3/044* (2013.01); *G06F 3/0416* (2013.01); *H01L 41/1132* (2013.01); *G06F 3/047* (2013.01); *G06F 3/0414* (2013.01); *G06F 2203/04103* (2013.01)

(58) Field of Classification Search
CPC .... G02F 1/13394; G06F 3/016; G06F 3/0414; B06B 1/0292; H01L 41/081
USPC ................... 310/324; 345/173, 174
See application file for complete search history.

(56) References Cited

U.S. PATENT DOCUMENTS

| | | | |
|---|---|---|---|
| 9,419,544 B2 | 8/2016 | Kim et al. | |
| 9,483,984 B2 | 11/2016 | Seo et al. | |
| 2010/0156845 A1* | 6/2010 | Kim | G06F 3/016 345/174 |
| 2010/0277040 A1* | 11/2010 | Klee | B06B 1/0292 310/324 |
| 2010/0328242 A1* | 12/2010 | Paleczny | G06F 3/016 345/173 |
| 2013/0265256 A1* | 10/2013 | Nathan | G06F 3/0414 345/173 |
| 2014/0362000 A1* | 12/2014 | Seo | G02F 1/13394 345/173 |

(Continued)

FOREIGN PATENT DOCUMENTS

| | | |
|---|---|---|
| JP | 2015-075892 | 4/2015 |
| KR | 10-2014-0096644 | 8/2014 |
| KR | 10-2015-0030106 | 3/2015 |

OTHER PUBLICATIONS

Xinda Li, et al. Sponge-Temlated Macroporous Graphene Network for Piezoelectric ZnO Nanogenerator, Applied Materials 2015, pp. 20753-20760.

*Primary Examiner* — Abdul-Samad A Adediran

(74) *Attorney, Agent, or Firm* — Lewis Roca Rothgerber Christie LLP

(57) ABSTRACT

A touch sensing unit includes a touch sensor, a sensor line, a piezoelectric area, and a touch sensor controller. The touch sensor is arranged in an island shape. The sensor line is connected to the touch sensor. The piezoelectric area overlaps the touch sensor and is arranged in an island shape. The touch sensor controller receives a voltage from the piezoelectric area when the piezoelectric area receives pressure and determines a magnitude of the pressure based on the voltage.

20 Claims, 10 Drawing Sheets

(56) References Cited

U.S. PATENT DOCUMENTS

2015/0029118 A1 1/2015 Xu et al.
2016/0291729 A1* 10/2016 Schardt .................. G06F 3/016
2017/0228072 A1* 8/2017 Amin .................... H01L 41/081

* cited by examiner

[FIG 1]
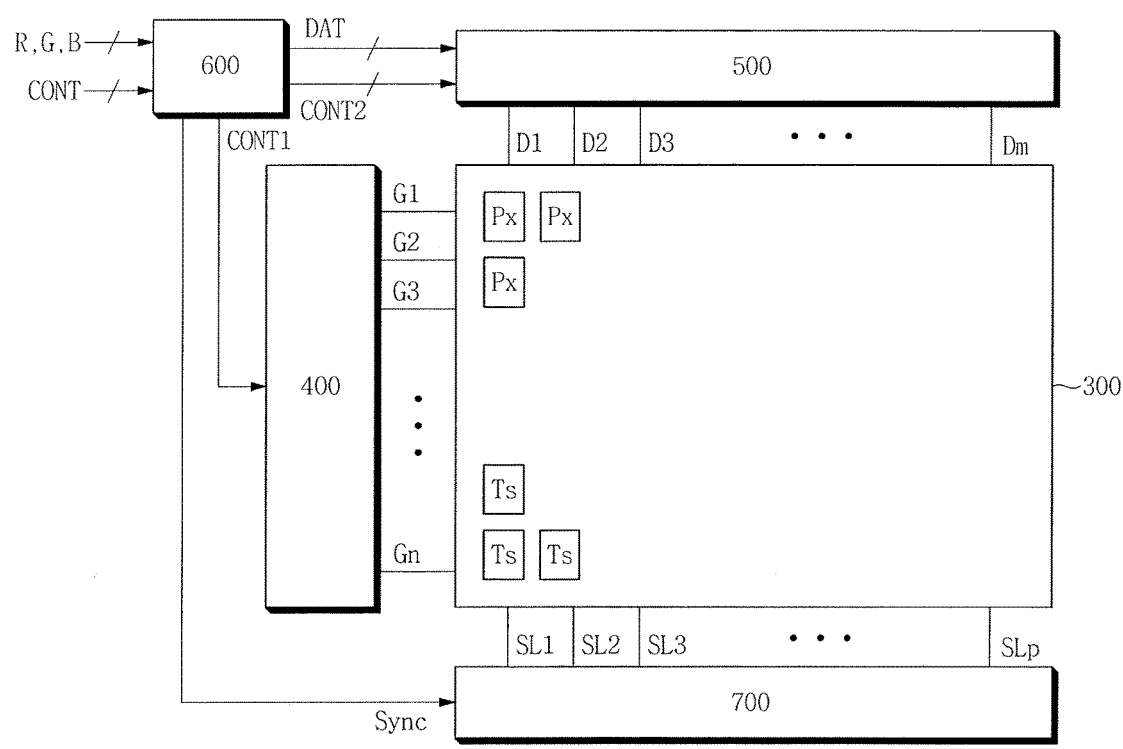

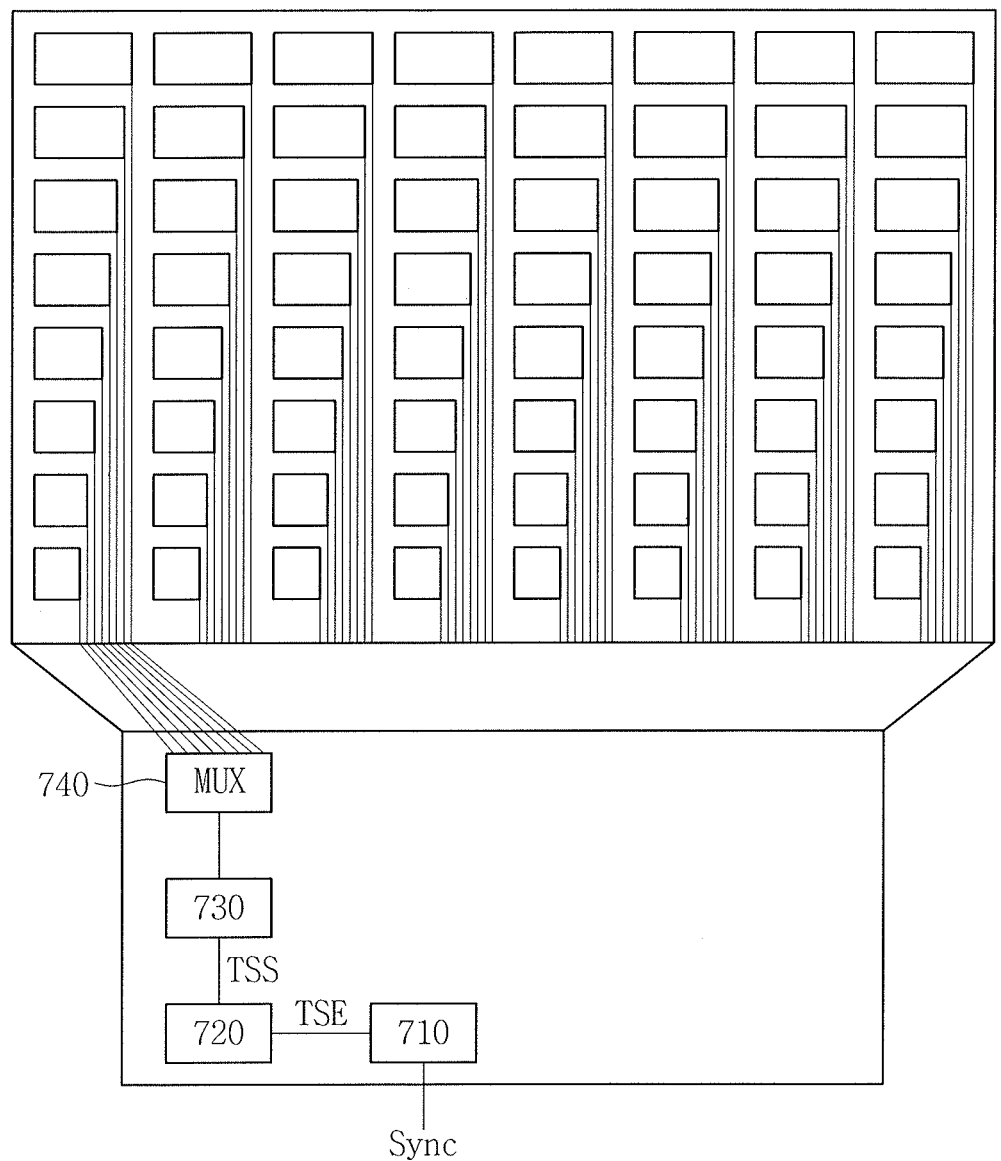

[FIG 3]
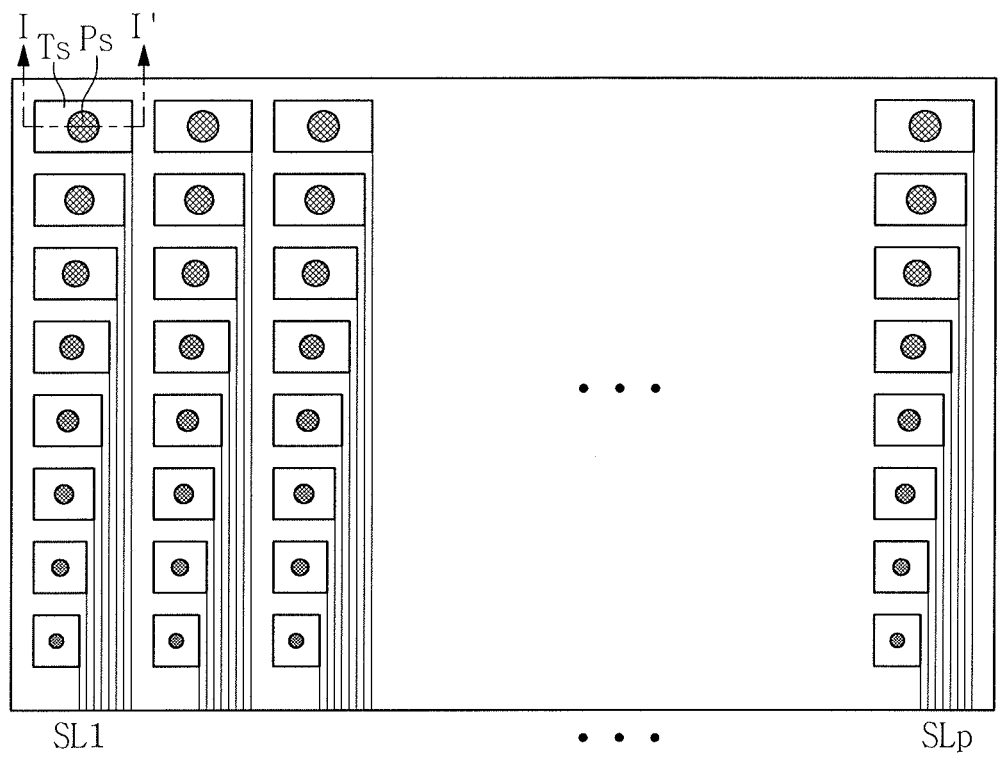
[FIG 4]
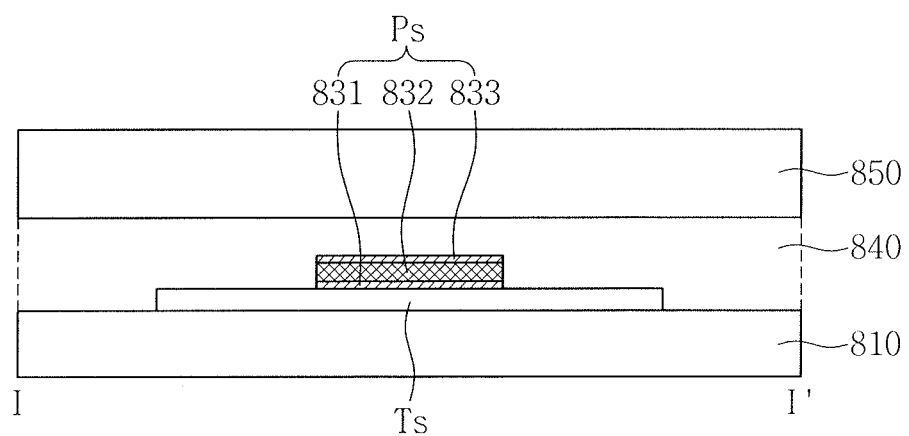

【FIG 5a】
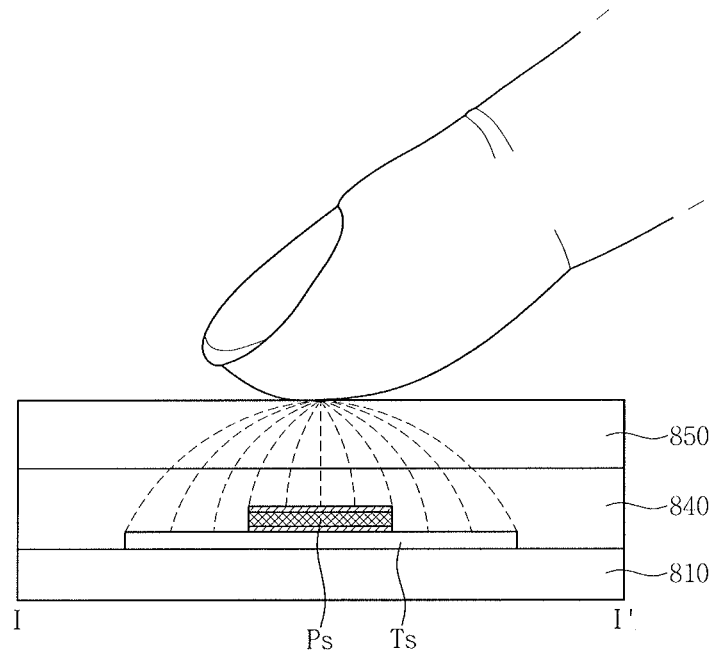
【FIG 5b】
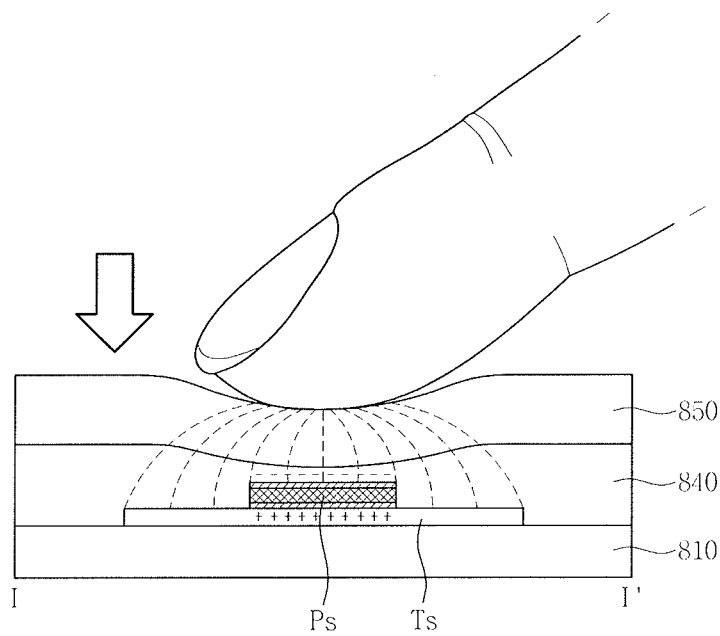

[FIG 6]
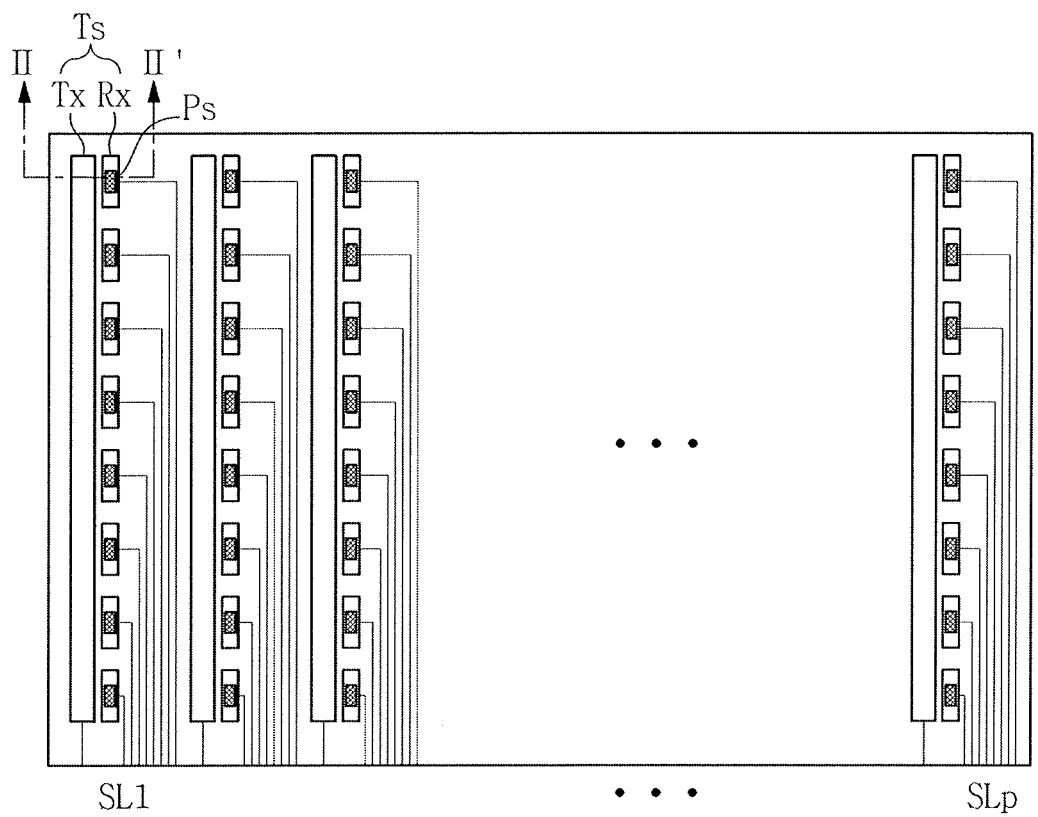
[FIG 7a]
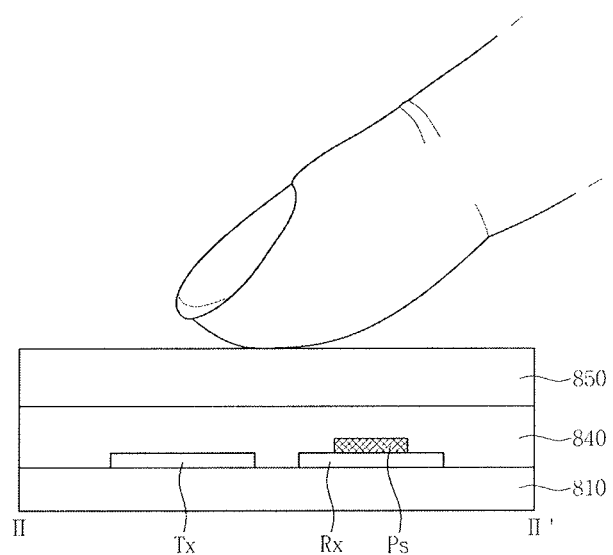

[FIG 7b]
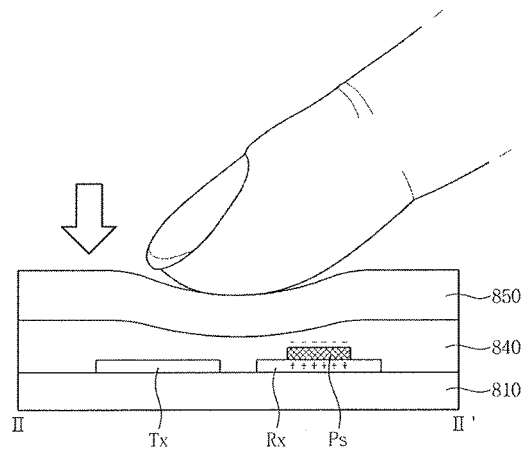
[FIG 8]
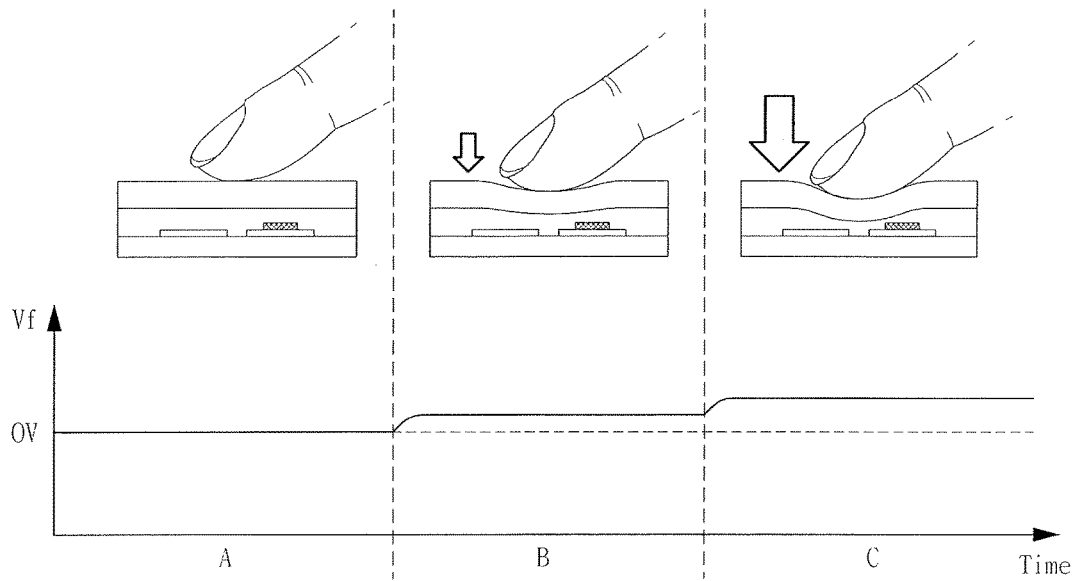

【FIG 9a】
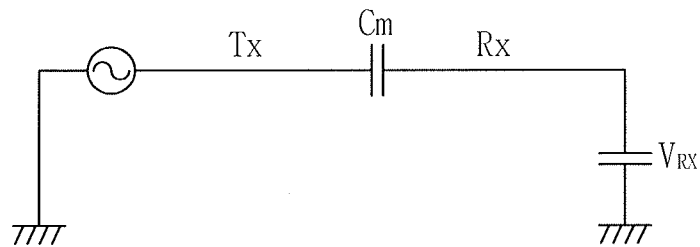
【FIG 9b】
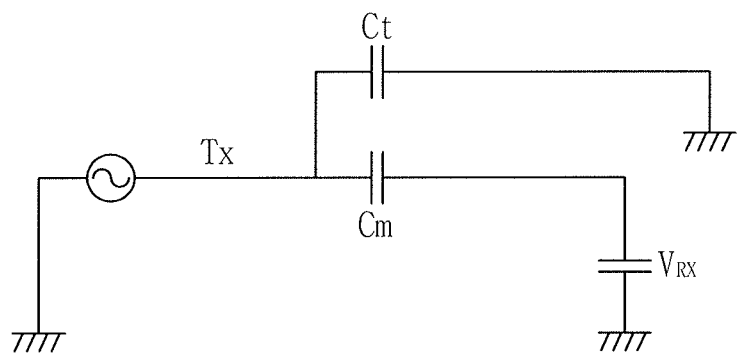
【FIG 9c】
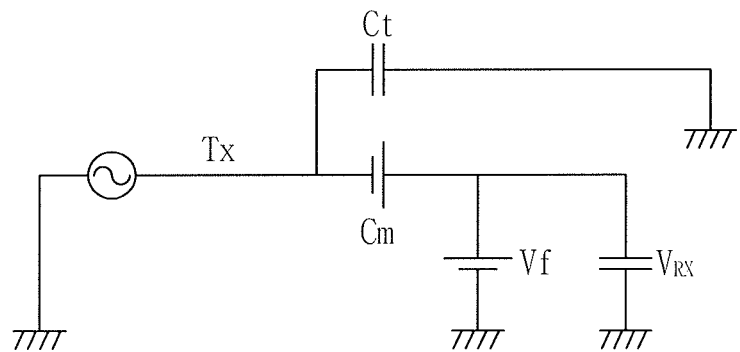

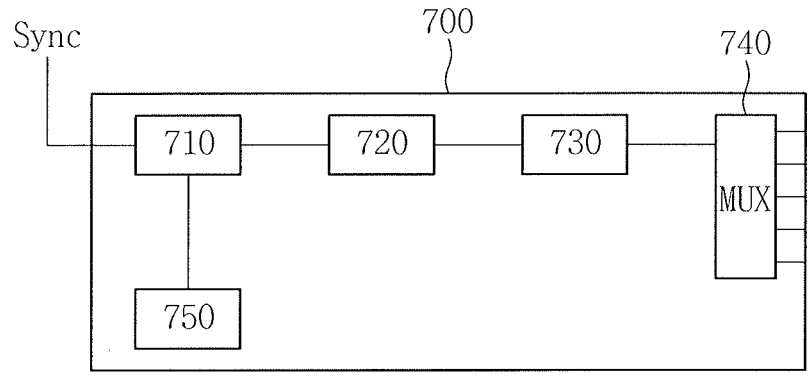
[FIG 10]
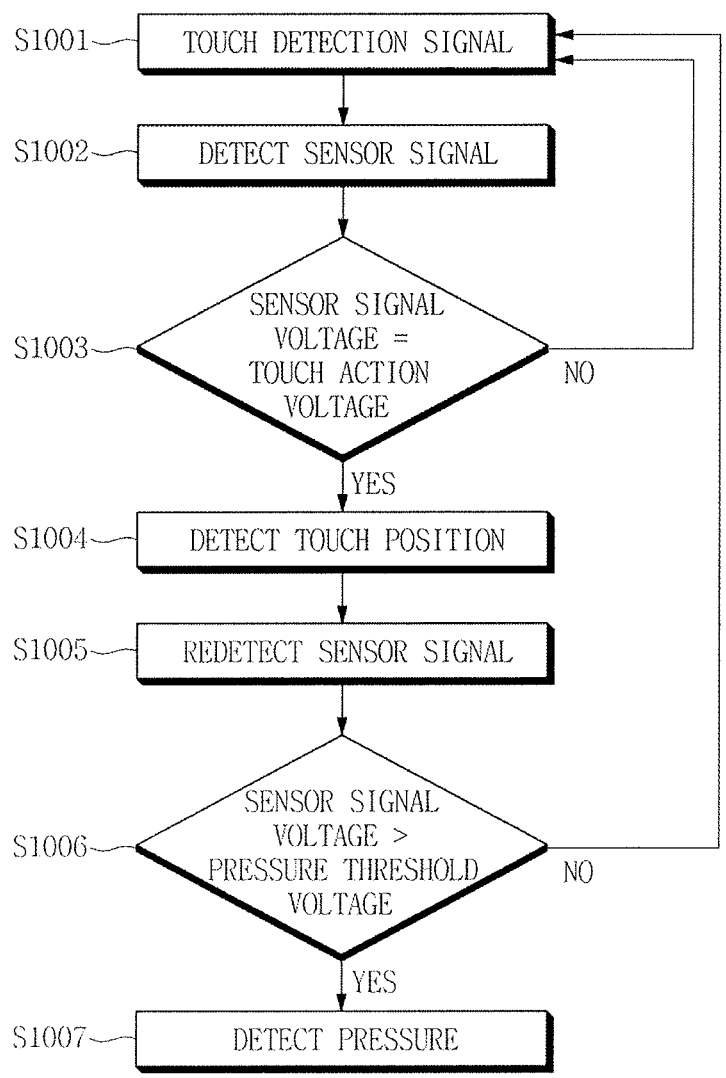
[FIG 11]

[FIG 12a]
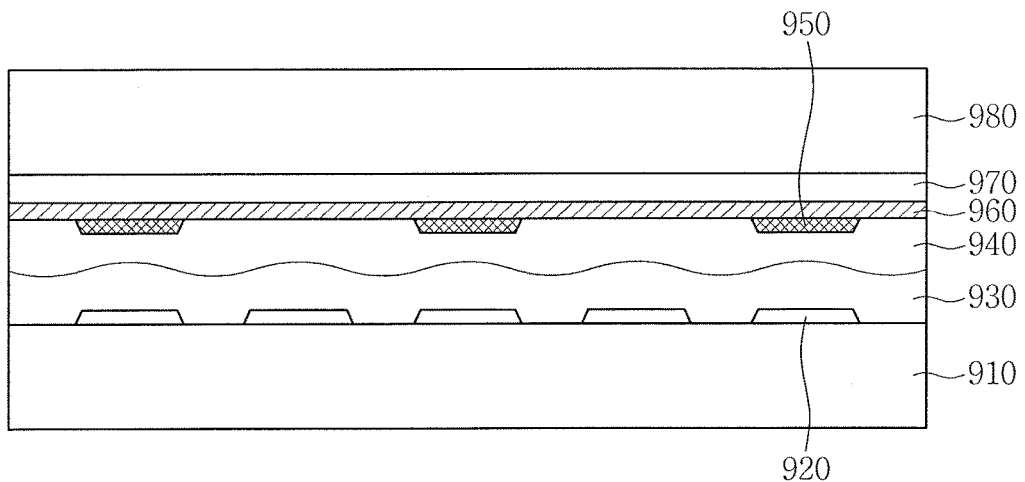
[FIG 12b]
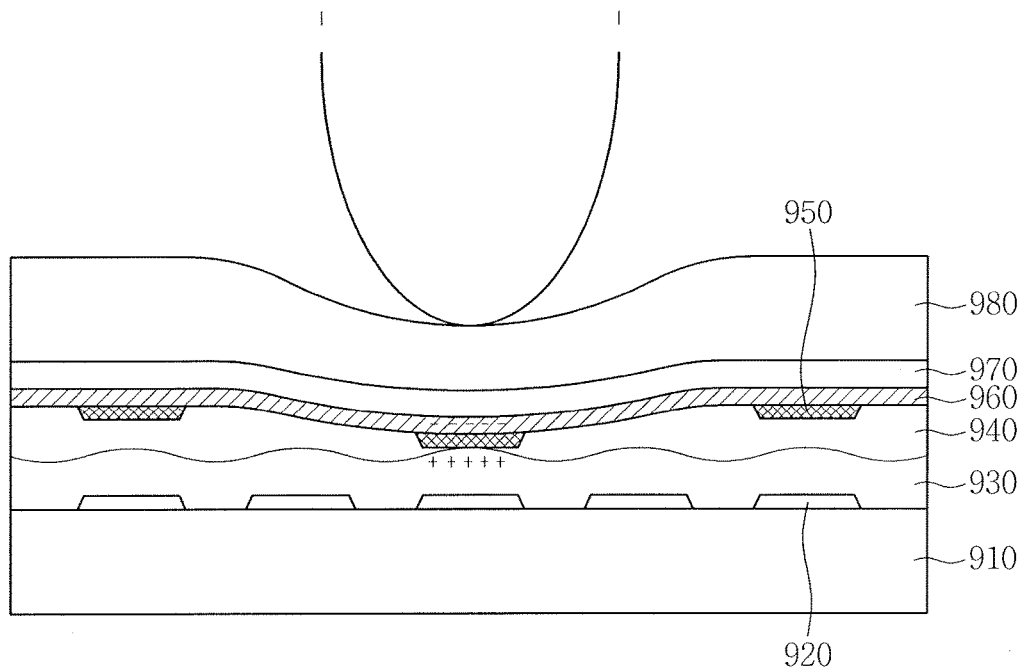

[FIG 13]
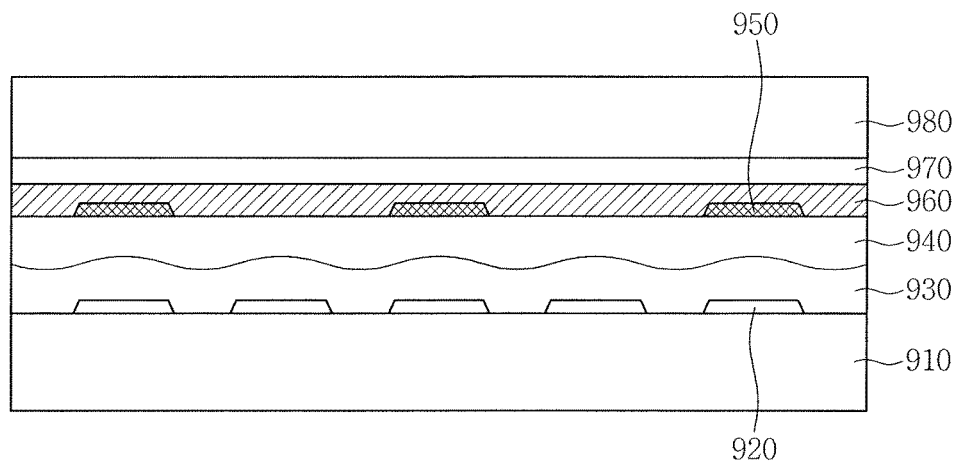
[FIG 14]
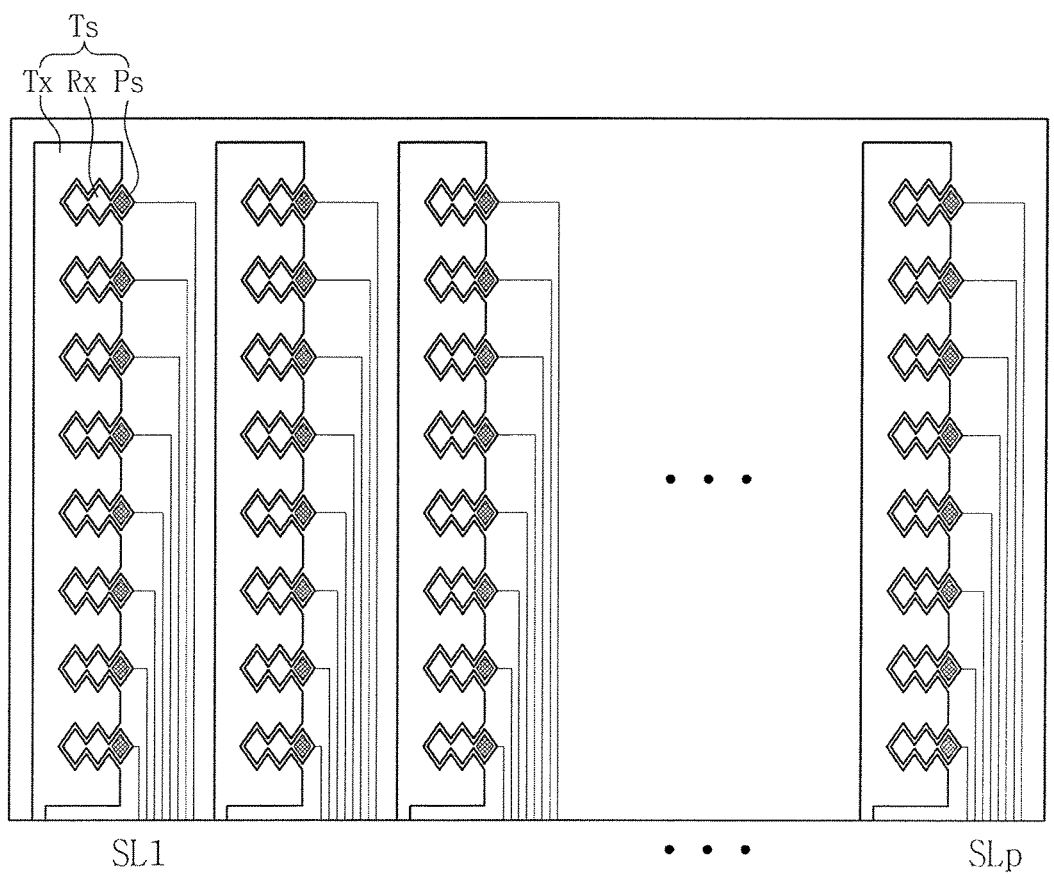

DISPLAY DEVICE

CROSS-REFERENCE TO RELATED APPLICATION

Korean Patent Application No. 10-2016-0120130, filed on Sep. 20, 2016, and entitled: "Display Device," is incorporated by reference herein in its entirety.

BACKGROUND

1. Field

One or more embodiments described herein relates to a display device.

2. Description of the Related Art

Laptop computers, mobile phones, portable multimedia players, tablet personal computers, and other electronic devices have displays, many of which are accompanied by touch screens for detecting the position of a user finger or stylus.

SUMMARY

In accordance with one or more embodiments, a touch sensing unit includes a substrate; a touch sensor on the substrate and arranged in an island shape; a sensor line connected to the touch sensor; a piezoelectric area overlapping the touch sensor and arranged in an island shape; and a touch sensor controller to receive a voltage from the piezoelectric area when the piezoelectric area receives pressure and to determine a magnitude of the pressure based on the voltage. The piezoelectric area may directly contacts the touch sensor.

The touch sensing unit may include an insulating layer coating the touch sensor and the piezoelectric area. The touch sensing unit may include a common electrode on the insulating layer, wherein the common electrode overlaps the piezoelectric area. The piezoelectric area may include at least one of a polymerpolyvinylidene fluoride (PVDF) polymer, carbon nano tube (CNT) PVDF, a ZnO nanowire, lead free Mn-doped $(K_{0.5}, Na_{0.5})NbO_3$, or $Pb(Zr_{1-x}Ti_x)O_3$. The piezoelectric area may have a light transmittance of about 80% or more.

A size of the piezoelectric area may increase with increasing distance from a terminal portion. The touch sensing unit may include an elastic layer between the touch sensor and the piezoelectric area; and an insulating layer coating the piezoelectric area. The touch sensing unit may include a common electrode on the insulating layer, wherein the common electrode overlaps the piezoelectric area. The touch sensor may receive an AC component of a voltage generated from the piezoelectric area without a DC component. The touch sensor and the sensor line may be integrally formed.

In accordance with one or more other embodiments, a touch sensing unit includes a substrate; a touch sensor on the substrate and including a transmit electrode and a receive electrode; a sensor line connected to the receive electrode; a piezoelectric area overlapping the receive electrode and arranged in an island shape; and a touch sensor controller to receive, through the receive electrode, a voltage generated by the piezoelectric area when pressure is applied to the piezoelectrica area and to determine a magnitude of the pressure. The piezoelectric area may directly contact the receive electrode.

The touch sensing unit may include a common electrode overlapping the piezoelectric area, wherein the common electrode is insulated from the piezoelectric area. The piezoelectric area may include at least one of a polymerpolyvinylidene fluoride (PVDF) polymer, carbon nano tube (CNT) PVDF, a ZnO nanowire, lead free Mn-doped $(K_{0.5}, Na_{0.5})NbO_3$, or $Pb(Zr_{1-x}Ti_x)O_3$. A size of the piezoelectric area may increase with increasing distance from a terminal portion.

The touch sensing unit may include an elastic layer between the receive electrode and the piezoelectric area; and an insulating layer coating the piezoelectric area. The elastic layer may include a first elastic layer and a second elastic layer, and an elastic modulus of the first elastic layer and an elastic modulus of the second elastic layer may be different from each other.

The touch sensing unit may include a common electrode on the insulating layer, wherein the common electrode overlaps the piezoelectric area. The receive electrode may receive an AC component of a voltage generated by the piezoelectric area without a DC component.

BRIEF DESCRIPTION OF THE DRAWINGS

Features will become apparent to those of skill in the art by describing in detail exemplary embodiments with reference to the attached drawings in which:

FIG. 1 illustrates one type of display device;

FIG. 2 illustrates one type of touch sensor controller;

FIG. 3 illustrates an embodiment of a touch sensing unit;

FIG. 4 illustrates a view along section line I-I' in FIG. 3;

FIGS. 5A and 5B illustrate examples of the operation of a touch sensing unit;

FIG. 6 illustrates another embodiment of a touch sensing unit;

FIGS. 7A and 7B illustrate other examples of the operation of a touch sensing unit;

FIG. 8 illustrates an embodiment of generating a voltage by a pressure sensor;

FIGS. 9A-9C illustrate examples of the operation of a pressure sensor;

FIG. 10 illustrates an embodiment of a touch sensor controller;

FIG. 11 illustrates an embodiment of the operation of a touch sensor;

FIG. 12A illustrates another embodiment of a touch sensing pattern and FIG. 12B illustrates another embodiment of the operation of a touch sensor pattern;

FIG. 13 illustrates another embodiment of a touch sensor pattern; and

FIG. 14 illustrates another embodiment of a touch sensor pattern.

DETAILED DESCRIPTION

Example embodiments are described with reference to the drawings; however, they may be embodied in different forms and should not be construed as limited to the embodiments set forth herein. Rather, these embodiments are provided so that this disclosure will be thorough and complete, and will convey exemplary implementations to those skilled in the art. The embodiments (or portions thereof) may be combined to form additional embodiments In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

FIG. 1 illustrates one type of a display device which includes a display panel 300; a scan driver 400, a data driver 500, a touch sensor, a touch sensor controller 700 coupled to the display panel 300, and a signal controller 600 for controlling the scan driver 400 and the data driver 500.

The display panel 300 includes a plurality of scan signal lines G1 to Gn, a plurality of data lines D1 to Dm, and a plurality of pixels PX connected to the scan signal lines G1 to Gn and data lines D1 to Dm. The display panel 300 may include a touch sensing unit embedded therein and which includes touch sensors Ts connected to sensor electrodes SL1 to SLp and arranged in a matrix form. A separate touch sensing unit including the touch sensors Ts may be attached to a front surface portion of the display panel 300.

The scan signal lines G1 to Gn extend substantially in a row direction and transmit a gate signal including a gate-on voltage for turning on a switching element such as a thin film transistor ("TFT") connected to each pixel PX and a gate-off voltage capable of turning off the switching element.

The data lines D1 to Dm extend substantially in a column direction and transmit a data voltage when the switch element connected to each pixel PX is turned on.

Each pixel PX are spatially arranged to emit light of one of a plurality of primary colors. In one case, a plurality of pixels may display primary colors over time. Thus, a desired color may be represented by combining the primary colors in spatial and temporal terms. A common voltage and a data voltage may be applied to each pixel PX.

The signal controller 600 receives, from an external graphics processing unit, an input image signal R, G, and B and one or more control signals CONT (e.g., horizontal synchronization signal, vertical synchronization signal, clock signal, data enable signal, etc.). The signal controller 600 processes the image signal R, G, and B based on the image signal R, G and B and the control signals CONT in accordance with operation conditions of the display panel 300 and generates and outputs an image data DAT, a gate control signal CONT1, a data control signal CONT2 and a clock signal. The signal controller 600 also outputs a synchronization signal Sync to touch sensor controller 700.

The gate control signal CONT1 includes a scan start pulse vertical signal STV for instructing start of scanning and a clock pulse vertical signal CPV for generating a gate-on voltage. An output period of the scan start pulse vertical signal STV coincides with one frame (or a refresh rate). The gate control signal CONT1 may further include an output enable signal OE that defines the duration of the gate-on voltage.

The data control signal CONT2 includes a horizontal start signal and a load signal. The horizontal start signal instructs start of transmission of the image data DAT for pixels in one row. The load signal instructs transmission of a corresponding data voltage to the data lines D1 to Dm.

The scan driver 400 applies a gate-on voltage and a gate-off voltage to the scan signal lines G1 to Gn according to the gate control signal CONT1.

The data driver 500 receives the data control signal CONT2 and the image data DAT from the signal controller 600, converts the image data DAT to data voltages based on gray level voltages from a gray level voltage generator, and applies the data voltages to the data lines D1 to Dm. The data voltages may include a data voltage of a positive polarity and a data voltage of a negative polarity. The data voltages of positive and negative polarities may be alternately applied on a frame, row and/or column basis.

The sensor electrodes SL1 to SLp extend substantially in a row direction or a column direction and are connected to the respective touch sensors Ts to transmit a touch detection signal and a sensor signal. The touch sensor Ts may generate a sensor signal based on a touch in a self-capacitance manner. The touch sensor Ts may receive a touch detection signal from the sensor electrodes SL1 to SLp and output a sensor signal reflecting a capacitance change due to a touch of an external object (e.g., finger or stylus) to the touch sensor controller 700 through the sensor electrodes SL1 to SLp.

In addition, the touch sensor Ts may generate a sensor signal based on the touch in a mutual capacitance method. The touch sensor Ts of a mutual capacitance type includes a touch transmit electrode TX and a touch receive electrode RX. The touch transmit electrode Tx is a sensor electrode for transmitting a touch detection signal and the touch receive electrode Rx is an electrode for receiving the touch detection signal to generate a sensor signal.

FIG. 2 illustrates that the touch sensor controller 700 is applied to a touch sensor Ts of a self-capacitance type. The touch sensor controller 700 generates and transmits a touch detection signal to be applied to the touch sensor Ts and receives the sensor signal from the touch sensor Ts to generate a touch information.

The touch sensor controller 700 includes a timing generation unit 710, a signal generating and/or processing unit 720, a signal transceiver 730, and a multiplexer 740. The timing generation unit 710 generates and outputs a scan enable signal TSE based on the synchronization signal Sync from the signal controller 600. The signal generating and/or processing unit 720 generates and outputs a touch detection signal TSS based on the scan enable signal TSE. The signal transceiver 730 converts the touch detection signal TSS to an analog signal. The multiplexer 740 selectively applies the touch detection signal TSS to the sensor electrodes SL1 to SLp.

A capacitance change caused by a touch may be output as a sensing signal from the touch sensor Ts through the sensor electrodes SL1 to SLp. The sensor signal is transmitted to the signal generating and/or processing unit 720 through the multiplexer 740 and the signal transceiver 730. The signal generating and/or processing unit 720 decodes and compares the sensor signal with the touch detection signal TSS to generate a touch information, e.g., the presence of a touch input or touch position. For example, when a finger touches the touch sensor Ts, the amplitude of the sensor signal may be less than the amplitude of the touch detection signal TSS. The signal generating and/or processing unit 720 may calculate the voltage difference to determine whether or not a touch has occurred.

FIG. 3 illustrates an embodiment of a touch sensing unit, and FIG. 4 is a cross-sectional view taken along line I-I' of FIG. 3. Referring to FIGS. 3 and 4, the touch sensing unit includes a substrate 810, a touch sensor Ts, a pressure sensor Ps, an insulating layer 840, and a protective layer 850. The substrate 810 may be a transparent glass substrate, a plastic substrate, or a front substrate of a display device.

The touch sensor Ts may detect a touch using one touch sensor Ts in a self-capacitance manner. The touch sensors Ts are on the substrate 810, arranged in first and second directions (e.g., an X direction and a Y direction), and connected to the sensor electrodes SL1 to SLp, respectively. The touch sensor controller 700 is connected to the touch sensor Ts through the sensor lines SL1 to SLp. The sensor signal output from the touch sensor Ts may be applied to the touch sensor controller 700, for example, through a terminal portion below the substrate.

The pressure sensor Ps is on the touch sensor Ts. A lower portion of the pressure sensor Ps may directly contact an upper portion of the touch sensor Is and may have a less area than an area of the touch sensor Ts. The pressure sensor Ps may include, for example, a piezoelectric element. The piezoelectric element includes a first electrode 831, a piezoelectric layer 832, and a second electrode 833. One piezoelectric element may not be connected to another piezoelectric element, may be arranged, for example, in an island shape, and may be independent of each other.

The first electrode 831 contacts an upper surface of the touch sensor Ts and electrically connects the piezoelectric layer 832 and the touch sensor Ts. The first electrode 831 may include a transparent conductive material, e.g., indium tin oxide (ITO), indium zinc oxide (IZO), or carbon nanotube (CNT).

The piezoelectric layer 832 on the first electrode 831 includes a laminate of piezoelectric materials that generates electricity by pressure. The piezoelectric element is a voltage generating element using a piezoelectric phenomenon, e.g., when the piezoelectric layer 832 contracts or expands due to external pressure, polarization is induced by a change in internal stress of the piezoelectric layer 832 and a voltage is generated. The piezoelectric layer 832 may be, for example, film which includes polymerpolyvinylidene fluoride (PVDF), carbon nano tube (CNT)/PVDF, a ZnO nanowire, lead free Mn-doped $(K_{0.5}, Na_{0.5})NbO_3$, PZT, $Pb(Zr,Ti)O_3$, or $PbZr_{1-x}Ti_xO_3$. In one embodiment, the piezoelectric layer 832 may included a plurality of layers laminated in a thickness direction. The piezoelectric layer 832 may have a thickness of, for example, about 80 μm or less and may have light transmittance. In one embodiment, the thickness of the piezoelectric layer 832 may be about 10 μm or less.

The second electrode 833 is on the piezoelectric layer 832 and may include, for example, a transparent conductive material.

The insulating layer 840 is on the piezoelectric element, may serve to attach the substrate 810 to the protective layer 850, and may coat upper and side surfaces of the piezoelectric element. In one embodiment, the insulating layer 840 may include polydimethylsiloxane (PDMS) which has excellent elasticity.

The protective layer 850 protects the touch sensor Ts and the pressure sensor Ps and provides a touch surface to a user. The protective layer 850 may include a flexible film to allow an externally applied pressure to be effectively transmitted to the pressure sensor Ps. In one embodiment, the protective layer 850 may include a glass coating film or a hard coating film. When the substrate 810 is a front substrate of the display device, the protective layer 850 may include, for example, a polarization film.

In FIG. 3, the lengths of the sensor lines SL1 to SLp are different depending, for example, on the position of the touch sensor Ts on the substrate. As the length of the sensor lines SL1 to SLp increases, the sensor signal may be attenuated by a voltage drop. An area of the touch sensor Ts may increase proportionally as the distance between the terminal portion and the touch sensor Ts increases. The voltage drop based on the length deviation of the sensor lines SL1 to SLp may be offset by adjusting the area of the touch sensor Ts, so that the touch sensor controller 700 may detect a touch position without correcting the voltage drop based on the sensor position.

In addition, as a distance between the terminal portion and the touch sensor Ts increases, the size of the pressure sensor Ps on the touch sensor Ts may also increase proportionally. The pressure may be detected, without correction, based on the position of the pressure sensor. This may be accomplished, for example, by adjusting the area ratio of the pressure sensor Ps. The amount of data processed by the touch sensor controller 700 may be reduced by area correction, so that touch position and pressure may be detected more quickly.

FIGS. 5A and 5B illustrates examples of the operation of the touch sensing unit.

Referring to FIG. 5A, when a touch object (e.g., a finger) approaches or touches the front surface of a touch sensing unit, a touch capacitor is formed on a path indicated by a dotted line between the touch sensor Ts and the touch object. The touch sensor controller applies a touch detection signal including a plurality of pulse waves to the touch sensor Ts and detects a sensor signal of the touch sensor based on the applied touch detection signal. When no touch occurs, a predetermined sensor signal voltage is detected based on the applied touch detection signal according to an RC delay determined based on the structure of the touch sensor Ts and the touch sensing unit.

In an exemplary embodiment, when an external touch occurs as illustrated in FIG. 5A, a touch capacitor is formed between the touch object and the touch sensor Ts. The touch capacitor increases RC delay, and a smaller voltage is detected as a sensor signal of the touch sensor Ts with respect to substantially the same touch detection signal. The touch sensor controller may detect a change in the sensor signal and determine that a touch occurred at the touch sensor Ts.

Referring to FIG. 5B, the touch object may deform the substrate downwards by applying pressure to the insulating layer. An electric potential difference is generated between opposite electrodes of the pressure sensor Ps by the externally applied pressure. The generated voltage of the pressure sensor Ps is transmitted as a sensor signal to the touch sensor controller 700 through the sensor lines SL1 to SLp connected to the touch sensor Ts. The generated voltage of the pressure sensor Ps may have a greater value than the sensor signal detected in the touch operation. The touch sensor controller 700 may analyze the voltage of the sensor signal to determine the position and magnitude of the applied pressure.

FIG. 6 illustrates an embodiment of a touch sensing unit of a mutual capacitance type. Referring to FIG. 6, the touch sensor Ts of this touch sensing unit includes a touch transmit electrode Tx and a touch receive electrode Rx. The touch transmit electrode Tx extends along one direction of a panel and faces the touch receive electrodes Rx, which are arranged parallel to the extension direction of the touch transmit electrodes Tx. Eight touch receive electrodes Rx are illustrated in FIG. 6 corresponding to one touch transmit electrode Tx. The numbers of touch transmit electrodes Tx and touch receive electrodes Rx may be different in an other embodiment, for example, based on the touch resolution of the touch sensing unit.

The touch receive electrode Rx may be connected to the touch sensor controller through the sensor lines SL1 to SLp. The touch sensor controller may determine the touch sensor Ts corresponding to a touch based on a touch detection signal applied to the touch transmit electrode Tx and may analyze a sensor signal detected from the touch receive electrode Rx.

FIGS. 7A and 7B illustrate examples of the operation of the touch sensing unit.

Referring to FIG. 7A, the touch sensing unit of a mutual capacitor type includes a substrate 810, a touch transmit electrode Tx, a touch receive electrode Rx, a pressure sensor Ps, an insulating layer 840, and a protective layer 850. The touch transmit electrode Tx and the touch receive electrode Rx are located on a substantially same surface on the substrate 810 and face each other on a plane. The touch transmit electrode Tx and the touch receive electrode Rx may be formed on a substantially same layer including substantially a same material. Examples of electrode materials may include a transparent conductive oxide (TCO) such as indium tin oxide (ITO) and indium zinc oxide (IZO), a conductive nanowire such as a silver nanowire (AgNW), and a metal mesh.

The pressure sensor Ps is on the touch receive electrode Rx and may include a piezoelectric element 830. The piezoelectric element 830 includes a first electrode 831, a piezoelectric layer 832, and a second electrode 833. One piezoelectric element 830 is not connected to another piezoelectric element 830 and is arranged in an island shape independently of each other.

The first electrode 831 of piezoelectric element 830 contacts an upper surface of the touch sensor Ps, in order to electrically connect the piezoelectric layer 832 and touch sensor Ts. The first electrode 831 may include a transparent conductive material. e.g., indium tin oxide (ITO), indium zinc oxide (IZO), or carbon nanotube (CNT).

The piezoelectric element 830 produces a voltage difference between an upper electrode and a lower electrode based on external pressure. The piezoelectric element 830 may be formed, for example, by laminating piezoelectric materials such as polymerpolyvinylidene fluoride (PVDF), carbon nano tube (CNT)/PVDF, a ZnO nanowire, lead free Mn-doped (K0.5, Na0.5)NbO3, PZT, Pb(Zr,Ti)O3, and PbZr1−xTixO3. The piezoelectric element 830 may be directly formed on an electrode by laminating the piezoelectric material. When formed in a deposition method, the piezoelectric element 830 may be directly deposited on the touch receive electrode Rx without using the first electrode.

The insulating layer 840 is on the piezoelectric element 830 and may attach the substrate 810 to the protective layer 850. The insulating layer 840 may include, for example, an adhesive having excellent light transmittance or polydimethylsiloxane (PDMS) with excellent elasticity.

The protective layer 850 protects the touch sensor Ts and the pressure sensor Ps and provides a touch surface to a user. The protective layer 850 may include a flexible film to allow an externally applied pressure to be effectively transmitted to the pressure sensor Ps. In one embodiment, the protective layer 850 may include a film, e.g., a glass coating film or a hard coating film. When the substrate 810 is a front substrate of the display device, the protective layer 850 may include, for example, a polarization film.

In order to detect a touch action, the touch transmit electrode Tx transmits pulse waves as a touch detection signal to be transmitted through a capacitor. A charging voltage may be based on a touch detection signal transmitted from the touch transmit electrode Tx to the touch receive electrode Rx when a touch action is not made. The charging voltage may be set as a reference voltage.

When a user contacts the protective layer 850 as in FIG. 7A, a touch capacitor is formed between the touch transmit electrode Tx and the touch object. Part of the touch detection signal output from the touch transmit electrode TX may leak through the touch capacitor. Thus, the position detection signal may not be entirely transmitted to the touch receive electrode Rx according to the amount of leakage. The touch detection signal transmitted to the touch receive electrode Rx may therefore have a voltage lower than the reference charging voltage in the untouched state.

The touch sensor controller may detect the position of a touch based on a comparison of the sensor signal applied to the touch receive electrode Rx with the reference voltage. When pressure is applied after the touch input as in FIG. 7B, an electric potential difference is generated between opposite electrodes of the pressure sensor Ps above the touch receive electrode Rx. FIG. 7B illustrates that a positive voltage is generated in the pressure sensor Ps in the direction of an electrode in contact with the touch receive electrode Rx.

FIG. 8 illustrates examples of voltage generation by a pressure sensor according to an exemplary embodiment, and more specifically examples of the amplitude of a pressure sensor voltage Vf generated in the pressure sensor Ps according to the magnitude of a touch applied to the touch sensor Ts and the pressure sensor Ps located above the touch sensor Ts.

Referring to FIG. 8, section A illustrates an example of a state where a touch occurs only on a surface of the touch sensing unit. The touch sensor Ts may detect the position at which the touch occurs in the section A. In such an exemplary embodiment, no additional pressure is applied to the pressure sensor Ps. Thus, a pressure sensor voltage Vf may be detected to be about 0 V.

Section B illustrates an example of a state where a user presses the surface of the touch sensing unit with a relatively weak force. The front surface of the touch sensing unit includes a flexible substrate or a protective film. A part of the front surface of the touch sensing unit is depressed inwards by the pressing force of the user. As a result, a relatively weak pressure is applied to the pressure sensor Ps. The pressure sensor Ps generates a relatively low pressure sensor voltage Vf corresponding to the weak external pressure.

Section C illustrates an example of a state where a user presses the surface of the touch sensing unit with a relatively strong force. The front surface of the touch sensing unit is deformed by the strong pressing force of the user, and a strong pressure is applied to the pressure sensor Ps. The pressure sensor Ps generates a relatively high pressure sensor voltage Vf corresponding to the strong external pressure.

FIG. 8 schematically illustrates the amplitude of the pressure sensor voltage Vf generated by the pressure. A pressure sensor voltage Vf actually measured from the outside may vary depending on the configuration of a connection circuit. In one embodiment, the pressure sensor Ps has a structure in which at least one electrode is not connected to another wiring. Accordingly, the touch sensor controller may detect an AC component of the pressure sensor voltage Vf through the touch receive electrode Rx.

For example, the touch sensor controller may detect a variation in voltage caused by pressing. Thus, offset noise induced by peripheral electronic devices may be blocked by removing the DC component of the pressure sensor voltage Vf.

FIGS. 9A, 9B, and 9C illustrate operations of a pressure sensor according to an exemplary embodiment based on equivalent circuit diagrams of a touch sensing unit of a mutual capacitance type.

FIG. 9A illustrates an example of an operational circuit of a touch sensing unit in a state where a touch is not made by a user. Referring to FIG. 9A, AC power serves as a touch detection signal output from the touch sensor controller. A mutual capacitor Cm (e.g., a parasitic capacitor) may formed between the touch transmit electrode Tx and the touch receive electrode Rx which face and oppose each other. The touch sensor controller connected to the touch receive electrode Rx detects a sensor signal voltage VRX of the touch receive electrode Rx.

The touch detection signal may be applied to the touch transmit electrode Tx, for transmission to the touch receive electrode Rx through the mutual capacitor Cm. The sensor signal voltage VRX of the touch receive electrode Rx is determined based on a capacitance of the mutual capacitor Cm and an RC delay of a resistance component determined based on a structure and materials of the touch sensing unit.

FIG. 9B illustrates an example of an operational circuit diagram of the touch sensing unit in a state in which a touch is made. Referring to FIG. 9B, a touch capacitor Ct is formed between the touch transmit electrode Tx and a touch object, separately from the mutual capacitor Cm. A part of the touch detection signal of the touch transmit electrode Tx may flow through the touch capacitor Ct. As a part of the touch detection signal is transmitted to the touch capacitor Ct, a sensor signal voltage VRX applied to the touch receive electrode Rx may be detected to be less than the sensor signal voltage VRX of FIG. 9A. The touch sensor controller may detect the touch state of each touch sensor by detecting the sensor signal voltage VRX.

FIG. 9C illustrates an example of an operational circuit diagram of a touch sensing unit, in which a pressure is applied to the touch sensing unit to generate a voltage from the pressure sensor. Referring to FIG. 9C, the touch capacitor Ct formed between the touch transmit electrode Tx and the touch object continues to remain. For example, as a distance between the touch transmit electrode Tx and the touch object is narrowed, the size of the touch capacitor Ct may increase.

An electric potential difference is generated between opposite end electrodes of a pressure sensor Ps that is externally applied with the pressure, and a pressure sensor voltage Vf is output. One electrode of the pressure sensor Ps is directly connected to the touch receive electrode Rx, and the pressure sensor voltage Vf is applied to one terminal of the mutual capacitor Cm. The pressure sensor voltage Vf may be greater than the sensor signal in an untouched state.

The pressure sensor voltage Vf is represented on the circuit diagram as a DC power because the piezoelectric element generates a DC voltage. However, the pressure sensor Ps according to an exemplary embodiment has a structure in which one electrode thereof is connected to a common electrode in series with a capacitor. An open circuit is formed on a DC power source. A closed circuit is formed on an AC circuit. Accordingly, only an AC component of the pressure sensor voltage Vf (e.g., a voltage fluctuation component) may be transmitted to the touch receive electrode Rx.

FIG. 10 illustrates an embodiment t of a touch sensor controller 700 that measures a touch position of the touch sensor Ts and a pressure generation of the pressure sensor Ps. The touch sensor controller 700 generates a touch detection signal and transmits the touch detection signal to the touch sensor Ts. The touch sensor controller 700 receives a sensor signal from the touch sensor Ts to generate a touch information. In addition, the touch sensor controller 700 analyzes a voltage of the sensor signal to determine a sensor signal factor due to the pressure sensor Ps.

The touch sensor controller 700 may include a timing generation unit 710, a signal generating and/or processing unit 720, a signal transceiver 730, a multiplexer 740, and a pressure signal analysis unit 750. The timing generation unit 710, the signal generating and/or processing unit 720, the signal transceiver 730, and the multiplexer 740 may be substantially the same as those corresponding to the embodiments in FIGS. 1 and 2.

The pressure signal analysis unit 750 analyzes a change in a sensor signal applied from an area determined to have been touched. Since a touch action occurs before pressure is applied to the pressure sensor Ps of the touch sensing unit, a determination value of the touch sensor Ts may be referred to.

The pressure signal analysis unit 750 detects an amplitude and a voltage generation timing of the sensor signal of the touch sensor Ts at which a touch occurs.

When the sensor signal of the touch receive electrode Rx is greater than the sensor signal in the untouched state, the pressure signal analysis unit 750 may determine that the input sensor signal is based on the pressure sensor voltage Vf. In addition, the sensor signal of the touch receive electrode Rx is a touch detection signal applied by the touch transmit electrode Tx. An application timing of the touch transmit electrode Tx may be synchronized with a detection timing of the sensor signal.

A voltage of the sensor signal based on the pressure sensor voltage Vf may not synchronized with the touch detection signal. The pressure signal analysis unit 750 may analyze a voltage amplitude of the sensor signal and a voltage generation timing to determine whether the sensor signal is generated by a touch action or output from the pressure sensor Ps.

FIG. 11 illustrates operation of a touch sensor according to an exemplary embodiment. First, the touch sensor controller 700 applies a touch detection signal to the touch sensor (S1001). The touch detection signal may include a plurality of pulse signals and is transmitted to the touch receive electrode Rx through a capacitor formed at the touch sensor.

The touch sensor controller 700 first detects a sensor signal applied to the touch receive electrode Rx (S1002). The sensor signal is a signal transmitted to the touch receive electrode Rx through a mutual capacitor, among the touch detection signals transmitted from the touch transmit electrode Tx.

The touch sensor controller 700 compares a voltage of the sensor signal with a touch action reference voltage (S1003). When the sensor signal voltage corresponds to the touch action reference voltage during a touch action, a position of the corresponding touch sensor is detected as a touch position (S1004).

The touch sensor controller 700 redetects a sensor signal of the touch sensor determined to be touched (S1005). A pressure generating action is performed after a touch action based on the order of action performed by a user. The time required for pressure sensing may be substantially reduced or minimized by re-detecting a sensor signal only with respect to the touch sensor Ts at the position where the touch action occurred.

The touch sensor controller 700 compares the sensor signal voltage and a pressure threshold voltage (S1006). The pressure threshold voltage is greater than a voltage generated during touch sensing. A sensor signal voltage output from a pressure sensor under pressure may be set to be greater than a sensor signal voltage of a touch sensor Ts in the untouched state. Thus, the pressure threshold voltage may be greater than the sensor signal voltage of the untouched touch sensor Ts. When the sensor signal voltage is greater than the pressure threshold voltage, the touch sensor controller 700 determines that the pressure is applied at the touch position (S1007).

FIG. 12A is a cross-sectional view illustrating another embodiment of a touch sensor pattern of a touch sensing unit, and FIG. 12B illustrates an example of operation of this touch sensor unit.

Referring to FIG. 12A, a touch sensing unit includes a substrate 910, a touch sensor 920, a first elastic layer 930, a second elastic layer 940, a pressure sensor 950, an insulating layer 960, a common electrode 970, and a protective layer 980. The substrate 910 may be, for example, a glass substrate including a rigid material that does not bend when pressure is applied or may be the front substrate of a display device.

The touch sensor 920 extends substantially in a row direction or substantially in a column direction and is connected to an external touch sensor controller to transmit a position detection signal and a sensor signal.

The first elastic layer 930 is optically transparent and may have a lower elastic modulus than the second elastic layer 940. The first elastic layer 930 has unevenness at an upper portion thereof, in order to substantially increase or maximize the application of external pressure to the pressure sensor 950.

The second elastic layer 940 includes a material having a greater elastic modulus than the first elastic layer 930 and is easily deformed by external pressure to allow the pressure to be applied to the pressure sensor 950. The second elastic layer 940 may include, for example, polydimethylsiloxane (PDMS) which is transparent and excellent in elasticity.

The pressure sensor 950 includes a piezoelectric element and may be formed into a film. The film may include, for example, one or more of polymerpolyvinylidene fluoride (PVDF), carbon nano tube (CNT)/PVDF, a ZnO nanowire, lead free Mn-doped (K0.5, Na0.5)NbO3, PZT, Pb(Zr,Ti)O3, and PbZr1–xTixO3 laminated in a thickness direction. The piezoelectric layer 832 may have, fore example, a thickness of about 80 μm or less and may have light transmittance. In one embodiment, the piezoelectric layer 832 may have a thickness of about 1 μm or less. Since the pressure sensor 950 is on a display surface of the display device, the pressure sensor 950 may have a light transmittance of about 80% or more.

In one embodiment, the number of the pressure sensors 950 may be less than the number of the touch sensors 920 or the pressure sensor 950 and the touch sensor 920 may be arranged in a one-to-one correspondence.

The insulating layer 960 insulates the pressure sensor 950 from the common electrode 970.

The common electrode 970 maintains a ground (or reference) voltage or a constant offset voltage and includes a transparent conductive layer. The common electrode 970 may include a transparent conductive material, e.g., indium tin oxide (ITO), indium zinc oxide (IZO), or carbon nanotube (CNT). The common electrode 970 may have a surface resistance of, for example, about $10^6$ ohm/sq or more, so that signal transmission to the touch capacitor Ct is not hindered by the common electrode 970. The common electrode 970 may be formed on an entire surface of the substrate or may only be in a region overlapping the pressure sensor 950.

The protective layer 980 may use a thin film substrate such as a PI film or a glass substrate. When a thin film substrate is used as the protective layer 980, the touch sensor 920 may be formed on the substrate 910. The common electrode 970, the insulating layer 960, and the pressure sensor 950 may be formed on the thin film substrate 980. The first elastic layer 930 and the second elastic layer 940 may be coupled to each other, and thus a touch sensing unit may be manufactured.

Referring to FIG. 12B, when an external pressure is applied to the touch sensing unit, the protective layer 980 is pushed inwards and the pressure sensor 950 below the protective layer 980 is pressed. The pressure sensor 950 may include a piezoelectric element. As the pressure is applied, an electric potential difference is generated across opposite ends of the pressure sensor 950. An AC component of the voltage generated from the pressure sensor 950 passes through the insulating layer 960 and is transmitted to the touch sensor controller through the touch sensor 920.

FIG. 13 is a cross-sectional view illustrating another embodiment of a touch sensor pattern of a touch sensor unit. Referring to FIG. 13, when the protective layer 980 includes a hard coating layer, a touch sensing unit includes a substrate 910, a touch sensor 920, a first elastic layer 930, and a second elastic layer 940. A pressure sensor 950, an insulating layer 960, a common electrode 970, and a protective layer 980 are sequentially laminated in the order listed on the second elastic layer 940.

FIG. 14 illustrates another embodiment of a touch sensor pattern of a touch sensor unit. Referring to FIG. 14, a touch transmit electrode Tx extends in a column direction of the substrate and has a rhombic-shaped groove. A touch receive electrode Rx is spaced apart from the touch transmit electrode Tx and is on an inner side of a recessed groove. The touch receive electrode Rx has substantially the same shape as the shape of the recessed groove of the touch transmit electrode Tx.

A mutual capacitor is formed along sides of a rhombus where the touch transmit electrode Tx and the touch receive electrode Rx face each other to form one touch sensor Ts. The touch receive electrodes Rx may be individually positioned in the column direction in which the touch transmit electrodes Tx extend. The touch receive electrode Rx includes three rhombic-shaped surfaces connected to each other and connected to a touch signal controller through sensor electrodes SL1 to SLp.

A pressure sensor Ps is located at one of the three rhombicp-shaped surfaces of the touch receive electrode Rx. The pressure sensor Ps may contact the touch receive electrode Rx on one side. When one electrode of the pressure sensor Ps contacts the touch receive electrode Rx, another electrode thereof is insulated without being connected to another conductor.

In one embodiment, the touch receive electrodes Rx may have a larger area with increasing distance away from a terminal portion of the sensor electrodes SL1 to SLp, taking into consideration insulating resistance of the sensor electrode. The pressure sensors may have a larger area with increasing distance away from the terminal portion of the sensor electrodes SL1 to SLp.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

The controllers, units, and other processing features of the embodiments described herein may be implemented in logic which, for example, may include hardware, software, or both. When implemented at least partially in hardware, the controllers, units, and other processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, units, and other processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

In accordance with one or more of the aforementioned embodiments, a touch sensing unit may detect touch pressure using a separate, island-shaped, piezoelectric element on an electrode of an electrostatic touch sensor. The touch sensing unit may be easily manufactured because pressure detecting signal wiring is not needed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A touch sensing unit, comprising:
   a substrate;
   a touch sensor on the substrate and arranged in a first island shape, the touch sensor providing a first signal indicating a change in self-capacitance of the touch sensor;
   a sensor line connected to the touch sensor;
   a pressure sensor including a piezoelectric material overlapping and electrically connected to the touch sensor and arranged in a second island shape, the pressure sensor providing a second signal indicating a voltage from the piezoelectric material; and
   a touch sensor controller to receive, through the sensor line, the first signal from the touch sensor, and to receive, through the touch sensor and the sensor line, the voltage from the piezoelectric material when the piezoelectric material receives pressure and to determine a magnitude of the pressure based on the voltage.

2. The touch sensing unit as claimed in claim 1, wherein the piezoelectric material directly contacts the touch sensor.

3. The touch sensing unit as claimed in claim 2, further comprising:
   an insulating layer coating the touch sensor and the piezoelectric material.

4. The touch sensing unit as claimed in claim 3, further comprising:
   a common electrode on the insulating layer,
   wherein the common electrode overlaps the piezoelectric material.

5. The touch sensing unit as claimed in claim 1, wherein the piezoelectric material includes at least one of a polyvinylidene fluoride (PVDF) polymer, carbon nano tube (CNT) PVDF, a ZnO nanowire, lead free Mn-doped $(K_{0.5}, Na_{0.5})NbO_3$, or $Pb(Zr_{1-x}Ti_x)O_3$.

6. The touch sensing unit as claimed in claim 5, wherein the piezoelectric material has a light transmittance of about 80% or more.

7. The touch sensing unit as claimed in claim 1, wherein a size of the pressure sensor including the piezoelectric material increases with increasing distance from a terminal portion.

8. The touch sensing unit as claimed in claim 1, further comprising:
   an elastic layer between the touch sensor and the piezoelectric material.

9. The touch sensing unit as claimed in claim 8, further comprising:
   a common electrode on the insulating layer,
   wherein the common electrode overlaps the piezoelectric material.

10. The touch sensing unit as claimed in claim 1, wherein the first signal is coupled to the second signal such that the first signal receives an AC component of a voltage generated from the piezoelectric material without a DC component.

11. The touch sensing unit as claimed in claim 1, wherein the touch sensor and the sensor line are integrally formed.

12. A touch sensing unit, comprising:
    a substrate;
    a touch sensor on the substrate and including a transmit electrode and a receive electrode, the touch sensor providing a first signal indicating a change in mutual-capacitance between the transmit electrode and the receive electrode;
    a sensor line connected to the receive electrode;
    a pressure sensor including a piezoelectric material overlapping and electrically connected to the receive electrode and arranged in an island shape, the pressure sensor providing a second signal indicating a voltage from the piezoelectric material; and
    a touch sensor controller to receive, through the receive electrode and the sensor line, the first signal, and to receive, through the receive electrode and the sensor line, the voltage generated by the piezoelectric material when pressure is applied to the piezoelectric material and to determine a magnitude of the pressure.

13. The touch sensing unit as claimed in claim 12, wherein the piezoelectric material directly contacts the receive electrode.

14. The touch sensing unit as claimed in claim 13, further comprising:
 a common electrode overlapping the piezoelectric material,
 wherein the common electrode is insulated from the piezoelectric material by an insulating layer.

15. The touch sensing unit as claimed in claim 12, wherein the piezoelectric material includes at least one of a polyvinylidene fluoride (PVDF) polymer, carbon nano tube (CNT) PVDF, a ZnO nanowire, lead free Mn-doped $(K_{0.5}Na_{0.5})NbO_3$, or $Pb(Zr_{1-x}Ti_x)O_3$.

16. The touch sensing unit as claimed in claim 12, wherein a size of the pressure sensor including the piezoelectric material increases with increasing distance from a terminal portion.

17. The touch sensing unit as claimed in claim 12, further comprising:
 an elastic layer between the receive electrode and the piezoelectric material.

18. The touch sensing unit as claimed in claim 17, wherein:
 the elastic layer includes a first elastic layer and a second elastic layer, and
 an elastic modulus of the first elastic layer and an elastic modulus of the second elastic layer are different from each other.

19. The touch sensing unit as claimed in claim 17, further comprising:
 a common electrode on the insulating layer,
 wherein the common electrode overlaps the piezoelectric material.

20. The touch sensing unit as claimed in claim 12, wherein the receive electrode is to receive the first signal and the second signal such that an AC component of a voltage generated by the piezoelectric material without a DC component is provided to the first signal.

* * * * *